(12) United States Patent
Tolles et al.

(10) Patent No.: US 7,165,565 B2
(45) Date of Patent: Jan. 23, 2007

(54) MEGASONIC WAFER CLEANING TANK WITH REFLECTOR FOR IMPROVED WAFER EDGE CLEANING

(75) Inventors: Robert D Tolles, San Jose, CA (US);
David P Alvarez, San Jose, CA (US);
Jianshe Tang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 235 days.

(21) Appl. No.: 10/736,242

(22) Filed: Dec. 15, 2003

(65) Prior Publication Data

US 2004/0154639 A1 Aug. 12, 2004

Related U.S. Application Data

(60) Provisional application No. 60/434,029, filed on Dec. 16, 2002.

(51) Int. Cl.
*B08B 3/12* (2006.01)
(52) U.S. Cl. .................. 134/184; 134/186; 134/902
(58) Field of Classification Search ............... 134/184, 134/186, 183, 182, 1, 902
See application file for complete search history.

(56) References Cited

U.S. PATENT DOCUMENTS

| | | | |
|---|---|---|---|
| 5,090,432 A * | 2/1992 | Bran | 134/139 |
| 5,379,785 A * | 1/1995 | Ohmori et al. | 134/184 |
| 6,026,832 A * | 2/2000 | Sato et al. | 137/184 |
| 6,311,702 B1 * | 11/2001 | Fishkin | 134/1.3 |
| 6,460,551 B1 | 10/2002 | Fishkin et al. | |

\* cited by examiner

*Primary Examiner*—Michael Barr
*Assistant Examiner*—Saeed Chaudhry
(74) *Attorney, Agent, or Firm*—Dugan and Dugan

(57) ABSTRACT

In a first aspect, a first apparatus is provided. The first apparatus includes (1) a tank adapted to contain fluid; (2) at least one support component mounted in the tank and adapted to support a substrate in a supported position at least partially submerged in the fluid; (3) a transducer adapted to output sonic energy into the fluid; and (4) a reflector positioned at a side of the substrate and adapted to reflect the sonic energy toward an edge of the substrate so as to provide a 100% duty cycle. The reflector is positioned such that the reflector does not obstruct a path employed to load the substrate into the supported position and to unload the substrate from the supported position. Numerous other aspects are provided.

14 Claims, 3 Drawing Sheets

MEGASONIC WAFER CLEANING TANK WITH REFLECTOR FOR IMPROVED WAFER EDGE CLEANING

The present application claims priority from U.S. Provisional Patent Application Ser. No. 60/434,029, filed Dec. 16, 2002, which is hereby incorporated by reference herein in its entirety.

BACKGROUND

For fabrication of semiconductor devices, thin slices or wafers of semiconductor material require polishing by a process that applies an abrasive slurry to the wafer's surfaces. A similar polishing step is performed to planarize dielectric or metal films during subsequent device processing on the semiconductor wafer. After polishing, slurry residue is generally cleaned or scrubbed from the wafer surfaces via mechanical scrubbing devices.

It is known to provide an apparatus for cleaning a semiconductor wafer in which the wafer is submerged in a fluid, and megasonic energy is directed toward the wafer. However, it would be desirable to improve the cleaning of the edge of the wafer in such an apparatus.

SUMMARY OF THE INVENTION

In a first aspect of the invention, a first apparatus is provided. The first apparatus includes (1) a tank adapted to contain fluid; (2) at least one support component mounted in the tank and adapted to support a substrate in a supported position at least partially submerged in the fluid; (3) a transducer adapted to output sonic energy into the fluid; and (4) a reflector positioned at a side of the substrate and adapted to reflect the sonic energy toward an edge of the substrate so as to provide a 100% duty cycle. The reflector is positioned such that the reflector does not obstruct a path employed to load the substrate into the supported position and to unload the substrate from the supported position.

In a second aspect of the invention, a second apparatus is provided. The second apparatus includes (1) a tank adapted to contain fluid; (2) a plurality of rollers mounted in the tank, including at least one driven roller, and adapted to support a substrate in a supported position at least partially submerged in the fluid while rotating the substrate; (3) a transducer adapted to output sonic energy into the fluid; (4) a first reflector mounted on a first wall of the tank and facing a first side of the substrate and adapted to reflect the sonic energy toward an edge of the substrate; and (5) a second reflector mounted on a second wall of the tank and facing a second side of the substrate and adapted to reflect the sonic energy toward the edge of the substrate. The first and second reflectors are adapted to provide a 100% duty cycle. Additionally, the first and second reflectors are positioned such that the first and second reflectors do not obstruct a path employed to load the substrate into the supported position and to unload the substrate from the supported position. Numerous other aspects are provided, as are methods in accordance with these other aspects of the invention.

Other features and aspects of the present invention will become more fully apparent from the following detailed description, the appended claims and the accompanying drawings.

DETAILED DESCRIPTION

Figure 1:
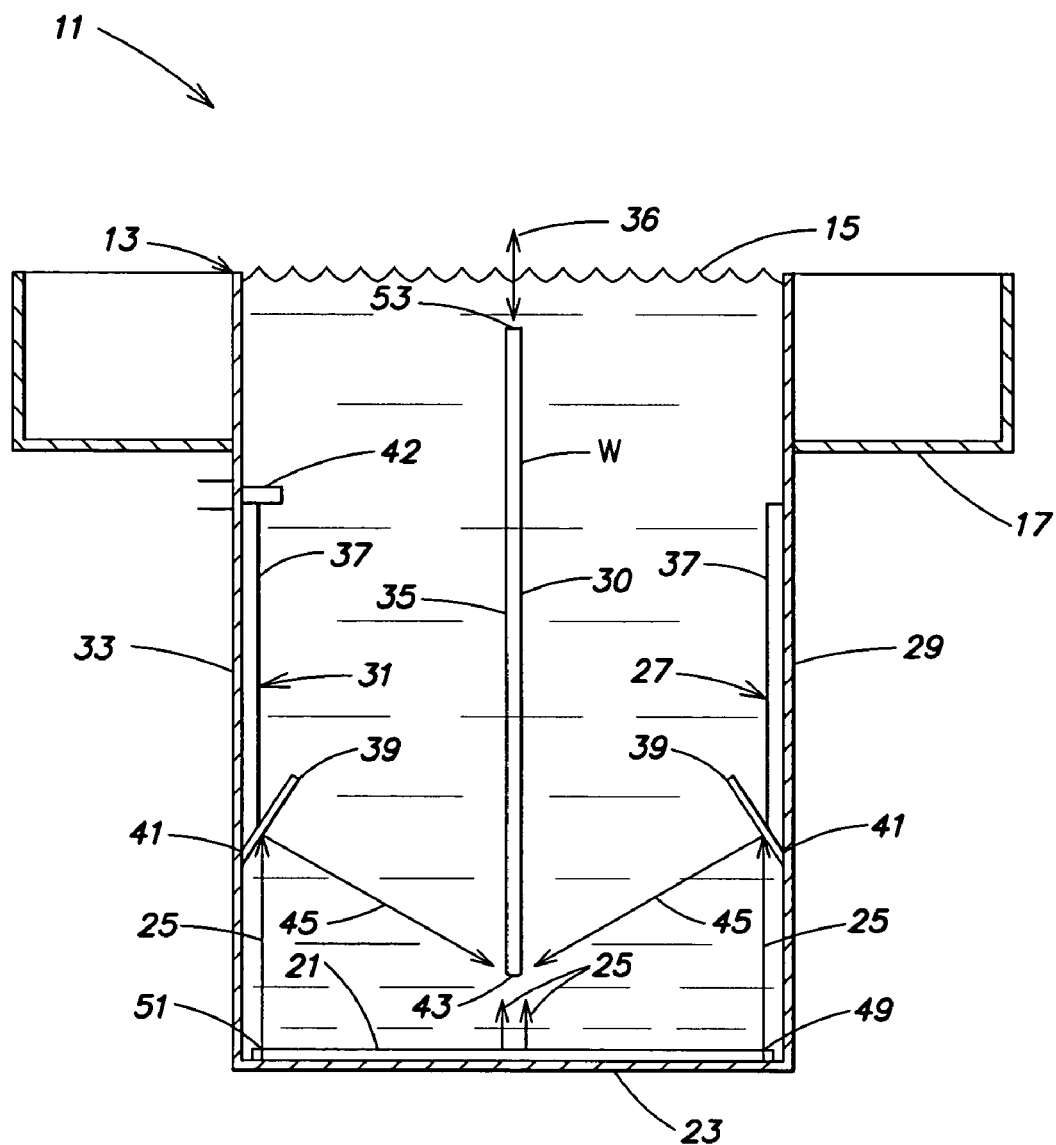
FIG. 1 is a simplified schematic side view of a wafer cleaning apparatus provided in accordance with the invention.
Figure 2:
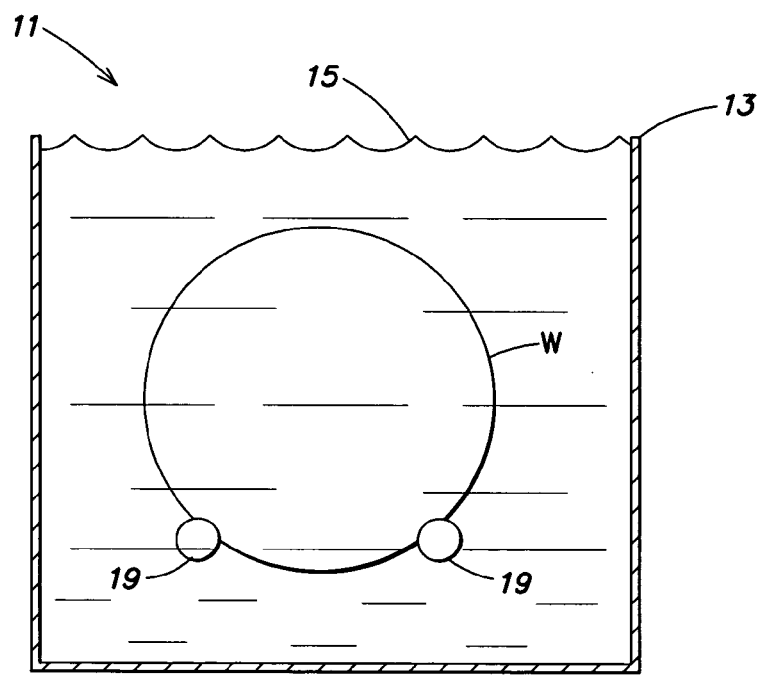
FIG. 2 is a simplified schematic front view of the inventive apparatus of FIG. 1.

FIG. 1 is a simplified schematic side view of a wafer cleaning apparatus 11 provided in accordance with the invention; and FIG. 2 is a simplified schematic front view of the inventive wafer cleaning apparatus 11. The inventive apparatus 11 includes a tank 13, which contains a fluid 15. An overflow weir 17 maybe associated with an upper portion of the tank 13 to handle fluid 15 which overflows from the tank 13. Conventional arrangements, which are not shown, may be provided to supply the fluid 15 to the tank 13, and to remove and/or recycle fluid 15 which overflows into the weir 17.

A wafer W is supported in the tank 13 in a supported position defined by two or more rollers 19 (FIG. 2). The rollers 19 may be provided in accordance with conventional practice to support the wafer W in a vertical orientation, partially or completely submerged in the fluid 15. Also in accordance with conventional practice, one or more of the rollers 19 may be driven so as to rotate the wafer W while the wafer W is in the supported position.

Referring again to FIG. 1, a transducer 21 is mounted at a bottom 23 of the tank 13. The transducer 21 may operate in accordance with conventional practices to output sonic energy, such as megasonic energy, in an upward direction (as indicated by arrows 25), into and through the fluid 15. Conventional arrangements may be provided to energize the transducer 21 and are omitted from the drawing.

In accordance with the invention, a first reflector assembly 27 is mounted on a first wall 29 of the tank 13, and facing a first side 30 of the wafer W. In one or more embodiments of the invention, a second reflector assembly 31 is mounted on a second wall 33 of the tank 13. It will be observed that the second wall 33 is opposite to the first wall 29, and that the second reflector assembly 31 faces a second side 35 of the wafer W. The reflector assemblies 27, 31 are positioned so as to be set off to respective sides of the wafer W when the wafer W is in the supported position as shown in FIGS. 1 and 2 on the rollers 19 (which only are shown in FIG. 2). Consequently the reflector assemblies 27, 31 do not obstruct a loading path (indicated by arrow 36, FIG. 1) by which the wafer W is moved to and removed from the supported position. As a result, the wafer W can be loaded into and removed from the tank 13 without moving the reflector assemblies 27, 31 which may be fixedly mounted in the tank 13 as described below.

Figure 3:
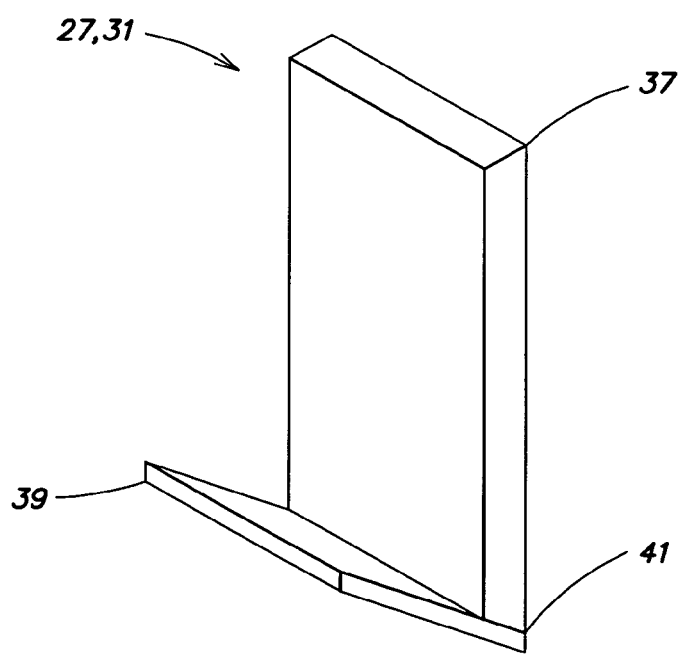
FIG. 3 is a perspective view of a reflector assembly that is part of the apparatus of FIG. 1.

FIG. 3 is a perspective view of a typical one of the reflector assemblies 27, 31. Referring to both FIGS. 1 and 3, each of the reflector assemblies 27, 31 includes a mounting bracket portion 37 which, for example, may be vertically oriented, and an inclined reflector surface 39 adapted to receive sonic energy from the transducer 21 and direct the sonic energy to an edge of the wafer W. For example, the reflector surface 39 may extend upwardly and outwardly from a bottom edge 41 of the mounting bracket portion 37. In FIG. 1, reference numeral 42 indicates a mounting arrangement adapted to secure the mounting bracket 37 of the second reflector assembly 31 to the wall 33 of the tank 13. The mounting arrangement 42 may be provided in accordance with conventional practices for mounting components inside megasonic tanks. A similar mounting arrangement (which is not shown to simplify the drawing) may be provided to secure the first reflector 27 to the wall 29 of the tank 13. In the example shown, the reflector assemblies 27, 31 are positioned relative to the supported position of the wafer W, and the reflector surfaces 39 are configured, such that the reflector surfaces 39 reflect the sonic energy 25 output from the transducer 21 toward a lower edge 43 of the wafer W, when the wafer W is in the supported position on the rollers 19 (FIG. 2).

Continuing to refer to FIG. 1, reference numerals 45 indicate the reflected sonic energy directed from the reflector surfaces 39 to the lower edge 43 of the wafer W. The reflector assemblies 27 and 29 are positioned and adapted so as to provide a 100% cleaning duty cycle for the lower edge 43 of the wafer W. That is, sonic energy is constantly reflected by the reflector surfaces 39 to the edge of the wafer W while the wafer W is in the supported position on the rollers 19, and the transducer 21 is energized.

Figure 4:
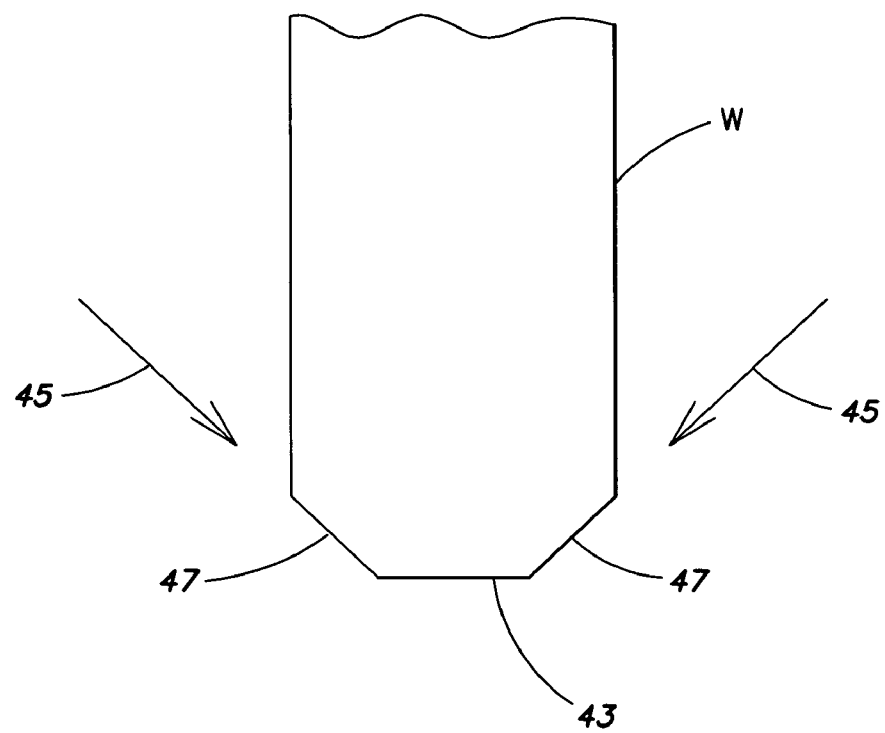
FIG. 4 is a partial cross sectional view of a wafer that is cleaned in the apparatus of FIG. 1, showing the edge of the wafer.

FIG. 4 is a partial cross sectional view of the wafer W showing the lower edge 43 thereof. As shown in FIG. 4, and consistent with conventional practices, the edge 43 of the wafer W may be beveled so as to have bevels 47. In one or more embodiments of the invention, the reflected sonic energy 45 may be reflected by the reflector surfaces 39 at angles that correspond to the angles of the bevels 47 of the beveled edge 43. That is, the directions of the reflected sonic energy 45 is substantially parallel to the planes of the bevels 47.

Referring again to FIG. 1, the transducer 21 may extend further in a lateral direction relative to the wafer W than transducers that are typically provided in megasonic tanks. For example, the transducer 21 may be arranged so as to extend from a point 49 that is below the reflector surface 39 of the first reflector assembly 27, to a point 51 that is below the reflector surface 39 of the second reflector assembly 31. Instead of the single transducer 21 shown in FIG. 1, two or more transducers may be provided. For example, three transducers may be provided, including one transducer positioned directly below the supported position of the wafer W and an additional transducer positioned at each one of points 49 and 51, below the reflector surfaces 39 of the first and second reflector assemblies 27, 31.

Figure 5:
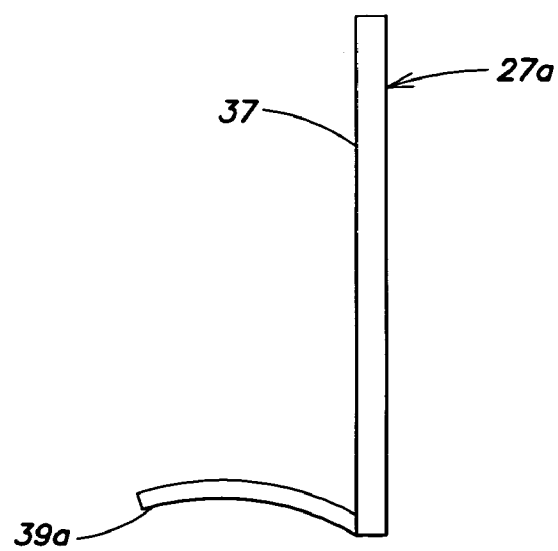
FIG. 5 is a side view of an alternative embodiment of the reflector assembly of FIG. 3.

FIG. 5 is a schematic side view of an alternative reflector assembly 27a that maybe substituted for either one or both of the reflector assemblies 27, 31 shown in FIG. 1. The reflector assemblies shown in FIGS. 1 and 3 are portrayed such that the reflector surfaces 39 thereof are substantially planar. However, in the alternative reflector assembly 27a of FIG. 5, the reflector surface 39a is curved (e.g., a parabolic curve adapted to focus reflected sonic energy at the lower edge 43 of the wafer W when the wafer W is at its supported position in the tank 13).

As another alternative, one or both of the reflector assemblies 27, 31 could be replaced with a reflector assembly in which the mounting bracket portion 37 extends downwardly from, rather than upwardly from, the reflector surface 39. According to other alternative arrangements of the reflector assemblies, the reflector surface 39 may be positioned at any point along the height of the mounting bracket 37. In still another alternative, one or both of the reflector assemblies may be positioned and configured so as to reflect sonic energy to an upper edge 53 of the wafer W when the wafer W is in the supported position in the tank 13. Similarly, one or both of the reflector assemblies may be positioned and configured to reflect sonic energy to any portion of the wafer W's edge (e.g., top, bottom, or side edges). Of course, reflector assemblies may be mounted along any of the walls of the tank 13 and be appropriately configured to reflect energy to the wafer W's edge.

In one or more other embodiments of the invention, either one of the reflector assemblies 27, 31 may be omitted.

The sonic energy output from the transducer 21 and reflected by the reflector assemblies 27, 31 may be any type of sonic energy, including megasonic energy, ultrasonic energy or both.

If a larger percentage of the wafers perimeter is sought to be contacted by sonic energy, the reflector surface may be sloped or stair stepped so as to maintain the reflector's focal point on the edge of the wafer. Note that in any embodiment the reflector's length is preferably chosen so as not to exceed the length wherein the reflector's focal point contacts the wafer's edge. Greater lengths may reflect sonic energy that misses the wafer and may cause undesirable sonic turbulence in the tank.

Instead of or in addition to the rollers 19, one or more alternative wafer support components may be provided to support the wafer W at the supported position in the tank 13.

Finally, it will be understood that rather than employing reflectors, transducers may be mounted and configured to direct energy to the wafer's edge. As previously mentioned, a significant advantage is achieved by positioning the transducer and/or reflector assembly outside the footprint of the supported wafer W. Accordingly, superior edge cleaning may be achieved without the addition of moving parts.

While the present invention has been described primarily with reference to wafers, it will be understood that the edge regions of other substrates, such as glass plates employed for flat panel displays, may be similarly cleaned.

Accordingly, while the present invention has been disclosed in connection with the preferred embodiments thereof, it should be understood that other embodiments may fall within the spirit and scope of the invention, as defined by the following claims.

The invention claimed is:

1. An apparatus comprising:
    a tank adapted to contain fluid and having vertical sidewalls;
    at least one support component mounted in the tank and adapted to support a substrate in a supported position at least partially submerged in the fluid;
    a transducer adapted to output sonic energy into the fluid at a bottom of the tank; and
    a reflector mountable to one of the vertical sidewalls, positioned at a side of the substrate, and adapted to reflect the sonic energy away from a central region of the substrate and toward an edge of the substrate so as to provide a 100% cleaning duty cycle to the edge of the substrate;
    wherein the reflector is positioned such that the reflector does not obstruct a path employed to load the substrate into the supported position and to unload the substrate from the supported position.

2. The apparatus of claim 1 wherein the reflector is entirely to the side of the substrate.

3. The apparatus of claim 1 wherein the reflector is curved so as to focus the reflected sonic energy at the edge of the substrate.

4. The apparatus of claim 1 wherein the reflector reflects the sonic energy at an angle that corresponds to an angle of an edge bevel of the substrate.

5. An apparatus comprising:
a tank adapted to contain fluid and having vertical sidewalls;
a plurality of rollers mounted in the tank and including at least one driven roller and adapted to support a substrate in a supported position at least partially submerged in the fluid while rotating the substrate;
a transducer adapted to output sonic energy into the fluid at a bottom of the tank;
a first reflector mountable on a first vertical sidewall of the tank on a first side of the substrate and adapted to reflect the sonic energy away from a central region of the substrate and toward an edge of the substrate; and
a second reflector mountable on a second vertical sidewall of the tank on a second side of the substrate and adapted to reflect the sonic energy away from a central region of the substrate and toward the edge of the substrate;
wherein:
the first and second reflectors are adapted to provide a 100% cleaning duty cycle to the edge of the substrate; and
the first and second reflectors are positioned such that the first and second reflectors do not obstruct a path employed to load the substrate into the supported position and to unload the substrate from the supported position.

6. The apparatus of claim 5 wherein the reflectors reflect the sonic energy at angles that correspond to angles of an edge bevel of the substrate.

7. The apparatus of claim 5 wherein the reflectors are curved so as to focus the reflected sonic energy at the edge of the substrate.

8. The apparatus of claim 5 wherein the transducer is positioned below the rollers.

9. An apparatus comprising:
a tank adapted to contain fluid and having vertical sidewalls;
at least one support component mounted in the tank and adapted to support a substrate in a supported position at least partially submerged in the fluid;
a transducer adapted to output sonic energy into the fluid at a bottom of the tank; and
a reflector mountable to one of the vertical sidewalls, positioned at a side of the substrate, and adapted to reflect the sonic energy toward an edge of the substrate so as to provide a 100% duty cycle;
wherein the reflector is positioned such that the reflector does not obstruct a path employed to load the substrate into the supported position and to unload the substrate from the supported position; and
wherein the reflector reflects the sonic energy at an angle that corresponds to an angle of an edge bevel of the substrate.

10. The apparatus of claim 9 wherein the reflector is interchangeable with a plurality of differently shaped reflectors.

11. The apparatus of claim 10 wherein the interchangeable reflector is curved and adapted to focus the sonic energy on the edge of the substrate.

12. An apparatus comprising:
a tank adapted to contain fluid and having vertical sidewalls;
a plurality of rollers mounted in the tank and including at least one driven roller and adapted to support a substrate in a supported position at least partially submerged in the fluid while rotating the substrate;
a transducer adapted to output sonic energy into the fluid at a bottom of the tank;
a first reflector mountable on a first sidewall of the tank and facing a first side of the substrate and adapted to reflect the sonic energy toward an edge of the substrate; and
a second reflector mountable on a second sidewall of the tank and facing a second side of the substrate and adapted to reflect the sonic energy toward the edge of the substrate;
wherein:
the first and second reflectors are adapted to provide a 100% duty cycle;
the first and second reflectors are positioned such that the first and second reflectors do not obstruct a path employed to load the substrate into the supported position and to unload the substrate from the supported position; and
the reflectors reflect the sonic energy at angles that correspond to angles of an edge bevel of the substrate.

13. The apparatus of claim 12 wherein the first and second reflectors are interchangeable with a plurality of differently shaped reflectors.

14. The apparatus of claim 13 wherein the interchangeable reflectors are curved and adapted to focus the sonic energy on the edge of the substrate.

* * * * *